(12) United States Patent
Matsuura

(10) Patent No.: US 11,355,320 B2
(45) Date of Patent: Jun. 7, 2022

(54) PLASMA PROCESSING APPARATUS AND METHOD FOR PLASMA PROCESSING

(71) Applicant: Tokyo Electron Limited, Tokyo (JP)

(72) Inventor: Hiroyuki Matsuura, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/416,596

(22) Filed: May 20, 2019

(65) Prior Publication Data
US 2019/0362946 A1  Nov. 28, 2019

(30) Foreign Application Priority Data

May 28, 2018 (JP) .............................. JP2018-101433

(51) Int. Cl.
  *H01L 21/00* (2006.01)
  *H01J 37/32* (2006.01)
(52) U.S. Cl.
  CPC .... *H01J 37/32449* (2013.01); *H01J 37/3255* (2013.01); *H01J 37/32082* (2013.01)
(58) Field of Classification Search
  CPC ................................................ H01J 37/32779
  See application file for complete search history.

(56) References Cited

U.S. PATENT DOCUMENTS

| | | | | |
|---|---|---|---|---|
| 4,422,407 A * | 12/1983 | Bessot | ..................... | C23C 16/50 118/723 E |
| 5,749,723 A * | 5/1998 | Okase | ..................... | C30B 31/10 432/241 |
| 5,885,071 A * | 3/1999 | Watanabe | ............. | C30B 35/002 432/264 |
| 6,060,396 A * | 5/2000 | Fukami | ..................... | C09G 1/02 216/89 |
| 6,067,930 A * | 5/2000 | Minato | ............. | H01J 37/32009 118/723 E |
| 6,514,582 B1 * | 2/2003 | Inaki | ................. | H01J 37/32467 428/34.4 |
| 7,094,708 B2 * | 8/2006 | Kato | ..................... | C23C 16/345 438/778 |
| 7,300,885 B2 * | 11/2007 | Hasebe | ................. | C23C 16/345 257/E21.269 |
| 7,351,668 B2 * | 4/2008 | Chou | ..................... | C23C 16/36 438/770 |
| 2002/0108710 A1 * | 8/2002 | Obuchi | ................... | C03C 15/00 156/345.31 |
| 2002/0108712 A1 * | 8/2002 | Obuchi | ................. | H01J 37/321 156/345.43 |

(Continued)

FOREIGN PATENT DOCUMENTS

| CN | 1089580 A | 7/1994 |
|---|---|---|
| JP | 04017330 A * | 1/1992 |

(Continued)

*Primary Examiner* — Sylvia MacArthur
*Assistant Examiner* — Michelle Crowell
(74) *Attorney, Agent, or Firm* — Abelman, Frayne & Schwab

(57) ABSTRACT

A plasma processing apparatus includes a plasma generator provided with a plasma electrode and performs plasma processing on a substrate accommodated in a processing container. At least a region corresponding to the plasma electrode of the plasma generator is formed of synthetic quartz.

13 Claims, 12 Drawing Sheets

(56) References Cited

U.S. PATENT DOCUMENTS

| | | | |
|---|---|---|---|
| 2006/0281337 A1* | 12/2006 | Matsuura | H01L 21/02211 438/787 |
| 2009/0098370 A1* | 4/2009 | Sato | C03C 23/008 428/333 |
| 2012/0267340 A1* | 10/2012 | Kakimoto | H01J 37/32091 216/37 |
| 2015/0275359 A1* | 10/2015 | Fukushima | C23C 16/345 118/712 |
| 2015/0353417 A1* | 12/2015 | Mori | G02B 5/0294 359/599 |
| 2017/0240455 A1* | 8/2017 | Chang | C03B 37/01205 |
| 2019/0084865 A1* | 3/2019 | Gonnet | C03B 37/01869 |

FOREIGN PATENT DOCUMENTS

| | | | |
|---|---|---|---|
| JP | 09115884 A | * | 5/1997 |
| JP | H10-321596 A | | 12/1998 |
| JP | 2002-313780 A | | 10/2002 |
| JP | 2002-367962 A | | 12/2002 |
| JP | 2004-343017 A | | 12/2004 |
| JP | 2006-13361 A | | 1/2006 |
| JP | 4329403 B | | 6/2009 |
| JP | 2013-222948 A | | 10/2013 |
| TW | 200414317 A | | 8/2004 |
| TW | 200817292 A | | 4/2008 |
| TW | 201740424 A | | 11/2017 |

* cited by examiner

PLASMA PROCESSING APPARATUS AND METHOD FOR PLASMA PROCESSING

CROSS-REFERENCE TO RELATED APPLICATIONS

This application is based on and claims priority from Japanese Patent Application No. 2018-101433 filed on May 28, 2018 with the Japan Patent Office, the disclosure of which is incorporated herein in its entirety by reference.

TECHNICAL FIELD

The present disclosure relates to a plasma processing apparatus and a method for plasma processing.

BACKGROUND

Japanese Patent No. 4329403 discloses a plasma processing apparatus in which a slit plate that has a gas flow slit formed in a longitudinal direction of a plasma generator, at an opening of the plasma generator provided with a plasma electrode.

SUMMARY

According to an aspect of the present disclosure, a plasma processing apparatus includes a processing container configured to accommodate a substrate, a plasma generator provided with a plasma electrode and configured to perform a plasma processing on the substrate accommodated in the processing container. At least a region of the plasma generator corresponding to the plasma electrode is formed of synthetic quartz.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, a plasma processing apparatus and a method for plasma processing according to an embodiment of the present disclosure will be described with reference to the accompanying drawings. In the present specification and drawings, substantially the same components may be denoted by the same symbols, and the overlapping descriptions thereof will be omitted.

Exemplary Embodiment

<Plasma Processing Apparatus>

Figure 1:
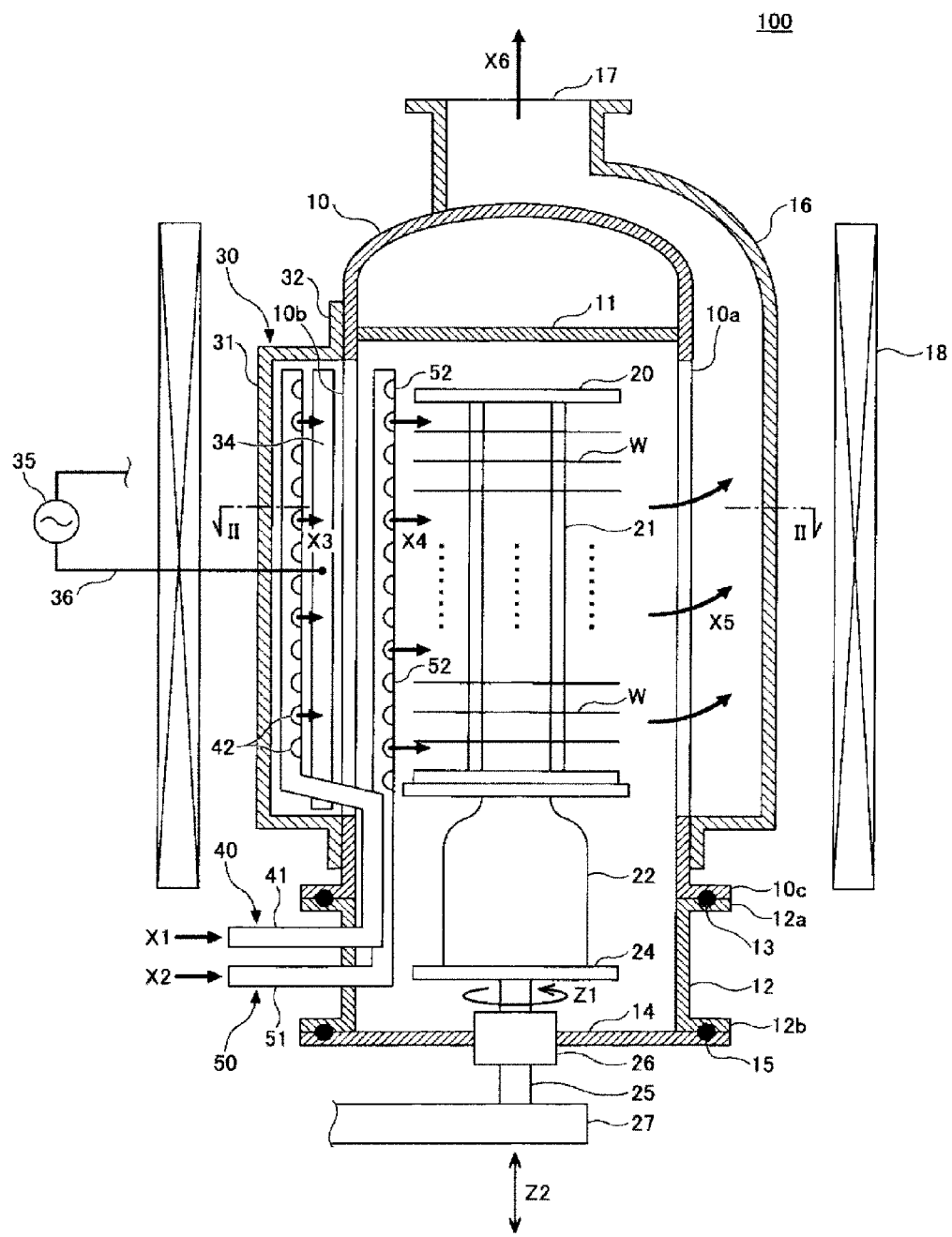
FIG. 1 is a cross-sectional view illustrating an example of an entire configuration of a plasma processing apparatus according to an embodiment.
Figure 2:
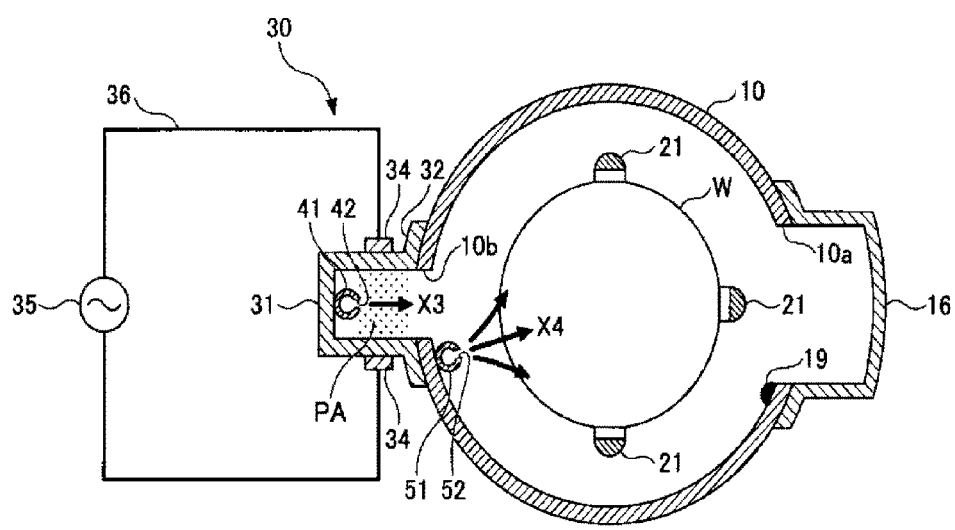
FIG. 2 is a view taken along line II-II in FIG. 1.
Figure 3:
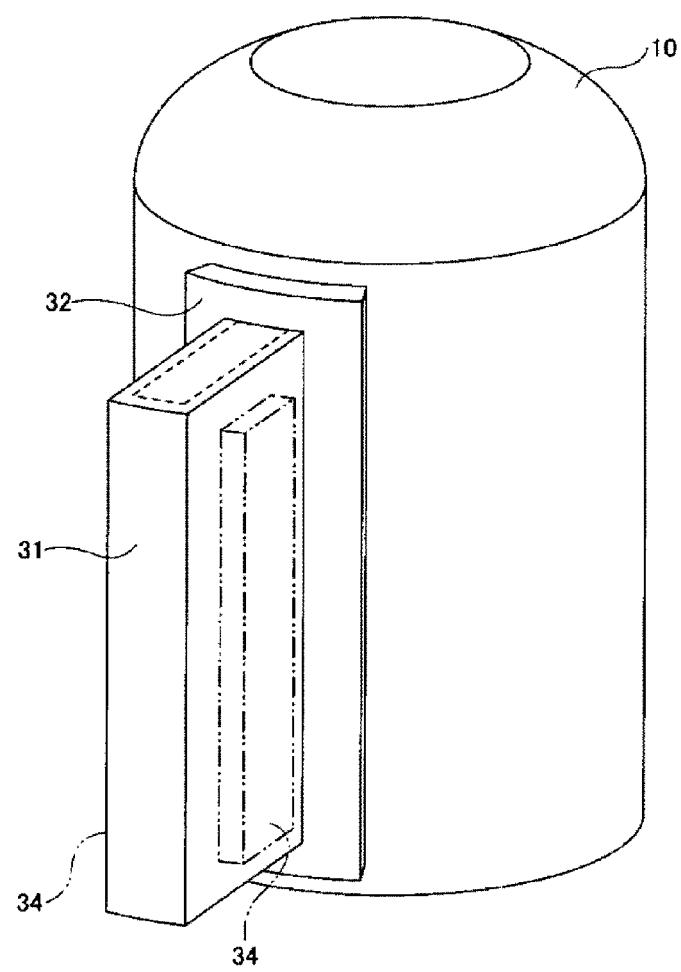
FIG. 3 is a view illustrating an example of a plasma generator together with a processing container.

Firstly, descriptions will be made on an example of a plasma processing apparatus according to the present disclosure with reference to FIGS. 1 to 3. Here, FIG. 1 is a cross-sectional view illustrating an example of an entire configuration of the plasma processing apparatus according to the embodiment, and FIG. 2 is a view taken along arrows II-II in FIG. 1. Further, FIG. 3 is a view illustrating an example of a plasma generator together with a processing container.

Hereinafter, "synthetic quartz" refers to synthetic silica glass that is synthesized by oxidizing high purity silicon tetrachloride ($SiCl_4$). Further, "natural quartz" refers to molten quartz glass (electric melting and flame melting) obtained by melting natural quartz powder. Further, synthetic quartz and natural quartz are collectively called as silica glass.

A plasma processing apparatus 100 illustrated in FIG. 1 is used for film forming processing by, for example, chemical vapor deposition (CVD) or atomic layer deposition (ALD). By these methods, a silicon nitride film (SiN film), a silicon oxide film ($SiO_2$ film), or a laminated film thereof is formed on a semiconductor wafer (hereinafter, referred to as a "wafer") which is a substrate W. The apparatus in the embodiment is properly used for, for example, forming a film, such as a liner film, an offset spacer film, a sidewall spacer film, among SiN films used around the gate electrode, using the ALD method that can obtain good step coverage. The plasma processing apparatus 100 is a batch type plasma processing apparatus that achieves good productivity while applying the ALD method. Hereinafter, film forming of the SiN film will be described as an example.

As illustrated in FIG. 1, the plasma processing apparatus 100 includes a cylindrical vertical processing container 10 with a ceiling that has an opening at its lower end. The processing container 10 may be referred to as, for example, a reaction tube or a process tube. The processing container 10 is formed of natural quartz, and a ceiling plate 11 formed of natural quartz is provided at the ceiling inside the processing container 10 so that the inside of the processing container 10 is sealed. Further, an annular flange 10c that projects outwardly is provided at the lower end of the processing container 10, and is supported by, for example, a cylindrical manifold 12 formed of stainless steel.

More specifically, an annular flange 12a that supports the processing container 10 is formed to project outwardly at the upper end of the cylindrical manifold 12, and further, an annular flange 12b that projects outwardly is formed at the lower end of the manifold 12. The annular flange 10c of the processing container 10 is air-tightly loaded on the annular flange 12a of the manifold 12 via a seal member 13 such as an O-ring. Further, a cover 14 is air-tightly attached to the annular flange 12b at the lower end of the cylindrical manifold 12 via a sealing member 15 such as an O-ring, and air-tightly closes the opening at the lower end of the processing container 10. The cover 14 is formed of, for example, stainless steel.

A magnetic fluid seal member 26 is attached to the center of the cover 14, and a rotary shaft 25 is rotatably and air-tightly inserted through (loosely fitted into) the magnetic fluid seal member 26. A lower end of the rotary shaft 25 is rotatably supported by a support arm 27 that extends laterally from a boat elevator (not illustrated) which is a lifting mechanism, and is rotatable in a Z1 direction by an actuator (not illustrated) such as a motor.

A rotary plate 24 is arranged at the upper end of the rotary shaft 25, and a heat retention cylinder 22 formed of natural quartz is mounted on the rotary plate 24. Then, a wafer boat 20 (an example of the substrate holder) that holds a plurality of wafers W that are parallel in the vertical direction at predetermined intervals is mounted on the heat retention cylinder 22. The wafer boat 20 is formed of natural quartz, and a support arm 21 included in the wafer boat 20 is configured to be capable of supporting the wafers W that are, for example, approximately 30 sheets to 50 sheets and have a diameter of approximately 300 mm, in multiple stages at substantially same pitches. By raising and lowering the boat elevator, the wafer boat 20 is integrally raised and lowered in a Z2 direction via the support arm 21, the cover 14, and the heat retention cylinder 22, and the wafer boat 20 may be carried into and out from the processing container 10.

A plasma gas supply pipe 41 that forms a plasma gas supply 40 is introduced via a gas introducing port (not illustrated) provided on a side wall of the manifold 12. The plasma gas supply 40 includes a plasma gas source, a mass flow controller (MFC), an opening/closing valve (all not illustrated) and the plasma gas supply pipe 41 formed of natural quartz.

A plasma gas is introduced into the processing container 10 in an X1 direction via the plasma gas supply pipe 41. Examples of the plasma gas may include a hydrogen-containing gas that does not contain oxygen and contains hydrogen, and more specifically, may include, for example, ammonia $NH_3$ gas or hydrogen $H_2$ gas.

Further, a raw material gas supply pipe 51 that forms a raw material gas supply 50 is introduced via a gas introducing port (not illustrated) provided on the side wall of the manifold 12. The raw material gas supply 50 includes a raw material gas source, a mass flow controller (MFC), an opening/closing valve (all not illustrated) and the raw material gas supply pipe 51 formed of natural quartz.

A raw material gas is introduced into the processing container 10 in an X2 direction via the raw material gas supply pipe 51. The raw material gas introduced into the processing container 10 is a non-plasma gas. Examples of the raw material gas may include dichlorosilane (DCS: $SiH_2Cl_2$) gas which is a silane-based gas. As other silane-based gases applied, monosilane ($SiH_4$), disilane ($Si_2H_6$), hexamethyldisilazane (HMDS), monochlorosilane ($SiH_3Cl$), trichlorosilane ($SiHCl_3$), tetrachlorosilane ($SiCl_4$), and disilylamine (DSA) may be applied. Further, trisilylamine (TSA) or vicinal butylaminosilane (BTBAS) may be applied.

An opening 10b that is provided to extend in the height direction of the processing container 10 is formed in a part of the side wall of the processing container 10, and a plasma generator 30 that is provided to extend in the height direction of the processing container 10 is formed so as to surround the opening 10b. Further, in the processing container 10, an elongated exhaust port 10a configured to evacuate the atmosphere in the processing container 10 is provided on the opposite side facing the plasma generator 30.

As illustrated in FIG. 1, an exhaust port cover member 16 that is formed of natural quartz and has a U-shaped cross section is attached on an outer peripheral surface of the side wall of the processing container 10 by welding at a location of the side wall of the processing container 10 where surrounds the exhaust port 10a. The exhaust port cover member 16 extends upward along the side wall of the processing container 10, and an exhaust port 17 is provided above the processing container 10. A vacuum exhaust unit that includes a vacuum pump or an opening/closing valve (all not illustrated) is communicated with the exhaust port 17. When the vacuum exhaust unit is operated, a gas in the processing container 10 that contains a processing gas is exhausted from the processing container 10 to the exhaust port cover member 16 in an X5 direction, and exhausted to the exhaust pump in an X6 direction via the exhaust port 17. By the operation of the vacuum exhaust supply, the inside of the processing container 10 may be evacuated to a predetermined vacuum degree in the process, and the processing gas or the like may be purged from the inside of the processing container 10 to the outside.

Further, a cylindrical heating unit 18 that heats the processing container 10 and the plurality of wafers W accommodated in the processing container 10 is provided so as to surround the outer periphery of the processing container 10. The heating unit 18 is formed of, for example, a heater. Further, as illustrated in FIG. 2, a temperature sensor 19 such as a thermocouple that is provided to measure the temperature in the processing container 10 and to control the temperature of the heating unit 18 is provided in the vicinity of the exhaust port cover member 16 in the processing container 10. Further, a pressure sensor (not illustrated) that is provided to measure the pressure in the processing container 10 and to control the exhaust of the vacuum exhaust unit is provided.

As illustrated in FIGS. 1 to 3, the plasma generator 30 has a U-shaped cross section orthogonal to the longitudinal direction, and has a hollow protrusion 31 which is elongated and hollow. A flange 32 is provided at the end portion of the hollow protrusion 31, and the flange 32 is attached to the side wall of the processing container 10 by, for example, welding. That is, the plasma generator 30 that is provided to protrude at the outside is formed so as to be communicated to the inside of the processing container 10, at the outside of the opening 10b of the side wall of the processing container 10, by welding air-tightly the hollow protrusion 31 to the outside of the processing container 10, via the flange 32. An insulating protective cover (not illustrated) made of natural quartz that surrounds the hollow protrusion 31 may be attached to the outside of the hollow protrusion 31.

Further, as illustrated in FIG. 1, both of a length of the opening 10b in the longitudinal direction and a length of the hollow protrusion 31 in the longitudinal direction substantially correspond to a length of the wafer boat 20 in the longitudinal direction.

The entire hollow protrusion 31 including the flange 32 illustrated in FIGS. 1 to 3 is formed of synthetic quartz. That is, among the members that form the plasma processing apparatus 100, all the members made of quartz other than the hollow protrusion 31 (including the flange 32) that forms the plasma generator 30 are formed of natural quartz, and the hollow protrusion 31 (including the flange 32) is solely formed of synthetic quartz. Although described in detail below, the plasma generator 30 is susceptible to damage such as generation of cracks due to sputtering or etching by plasma. In particular, the present inventors have found that ions or radicals that contain hydrogen generated by the hydrogen-containing gas which is a plasma gas selectively react with oxygen in silica glass, and the oxygen is extracted from the surface of the silica glass.

From the fact that synthetic quartz has a plurality of silanol groups (OH groups) as compared to natural quartz, it has been considered to apply synthetic quartz to the hollow protrusion 31 that forms the plasma generator 30. Further, synthetic quartz is expensive in material cost as compared to natural quartz. Considering these circumstances, only the hollow protrusion 31 (including the flange 32) is formed of synthetic quartz, and the other quartz members that form the plasma processing apparatus 100 are formed of natural quartz, thereby obtaining the plasma processing apparatus 100 in which the material cost is suppressed as much as possible.

The hollow protrusion 31 includes a pair of side walls facing each other across the hollow, and a pair of parallel flat plate type plasma electrodes 34 are arranged on the side surface of the pair of side walls. As illustrated in FIG. 3, a plasma electrode 34 that is provided to extend in the vertical direction as well is attached to the side wall of the hollow protrusion 31 that is provided to extend in the vertical direction. As illustrated in FIG. 2, a radio-frequency power supply 35 for plasma generation is connected to the pair of plasma electrodes 34 via a power supply line 36. Plasma can be generated by applying a radio-frequency voltage of, for example, 13.56 MHz to the plasma electrode 34, and as illustrated in FIG. 2, a plasma generating area PA is formed in the hollow of the hollow protrusion 31. A frequency of a radio-frequency voltage is not limited to 13.56 MHz, and a radio-frequency voltage of other frequencies such as 400 kHz may be applied. Although not illustrated, an auto-tuner, a system controller, a matching network, or the like may be interposed between the radio-frequency power supply 35 and the pair of plasma electrodes 34. As described above, the plasma generator 30 is constituted by, at least, the hollow protrusion 31, the pair of plasma electrodes 34, the radio-frequency power supply 35, and the power supply line 36.

Referring back to FIG. 1, the plasma gas supply pipe 41 introduced via the side wall of the manifold 12 is provided to be bent, and then, to extend upward along the side wall of the manifold 12 and the lower side wall of the processing container 10. Next, the plasma gas supply pipe 41 is bent to the hollow side (outside in the radial direction of the processing container 10) of the hollow protrusion 31 at a position below the hollow protrusion 31. The plasma gas supply pipe 41 bent to the hollow side is provided to be bent to the vertically upper side in the vicinity of an end wall (wall farthest from the processing container 10) of the hollow protrusion 31, and to extend to the vicinity of the upper end of the hollow protrusion 31 in the vertical direction. As illustrated in FIG. 2, the plasma supply pipe 41 is positioned outside the pair of plasma electrodes 34 (a position away from the processing container 10), as a vicinity of end wall of the hollow protrusion 31.

A plurality of plasma gas ejecting holes 42 are formed in the plasma gas supply pipe 41 at intervals in the longitudinal direction, and the plasma gas such as ammonia gas or hydrogen gas may be ejected substantially uniformly in the horizontal direction (X3 direction in FIGS. 1 and 2) via each plasma gas ejecting hole 42. As illustrated in FIG. 1, the plasma gas ejecting holes 42 are provided from the vicinity of the upper end to the vicinity of the lower end of the hollow protrusion 31 in the plasma gas supply pipe 41, and are configured to supply the plasma gas to all wafers W mounted on the wafer boat 20. The diameter of the plasma gas ejecting hole 42 may be set to, for example, approximately 0.4 mm.

As illustrated in FIG. 2, in a state where the radio-frequency voltage is applied between the pair of plasma electrodes 34 in the plasma generator 30, the plasma gas is supplied between the pair of plasma electrodes 34 from the plasma gas ejecting holes 42. The supplied plasma gas that is supplied reaches the plasma generating area PA, and is decomposed or activated in the plasma generating area PA, and then is introduced in the X3 direction while diffusing toward the center side of the processing container 10.

Meanwhile, as illustrated in FIGS. 1 and 2, the raw material gas supply pipe 51 that is introduced via the side wall of the manifold 12 is provided to be bent, and then, to extend upward along the side wall of the manifold 12, and again, along the side wall of the processing container 10, and reaches the vicinity of the upper end of the wafer boat 20. As illustrated in FIG. 2, although one raw material gas supply pipe 51 is provided on one side of the opening 10b of the side wall of the processing container 10 in the illustrated example, for example, two or more raw material gas supply pipes may be provided such that the opening 10b is sandwiched therebetween.

A plurality of raw material gas ejecting holes 52 are formed in the raw material gas supply pipe 51 at intervals in the longitudinal direction, and the raw material gas such as DCS gas may be ejected substantially uniformly in the horizontal direction (X3 direction in FIGS. 1 and 2) via each raw material gas ejecting hole 52. As illustrated in FIG. 1, the raw material gas ejecting holes 52 are provided from the lower end to the upper end of the wafer boat 20 in the raw material gas supply pipe 51, and are configured to supply the plasma gas to all wafers W mounted on the wafer boat 20.

The diameter of the raw material gas ejecting hole 52 may be set to for example, approximately 0.4 mm, similarly to the plasma gas ejecting hole 42.

Further, the plasma processing apparatus 100 includes a controller (not illustrated). The controller controls the operation of each component of the plasma processing apparatus 100, for example, the heating unit 18, the vacuum exhaust unit, the radio-frequency power supply 35 that constitutes the plasma generator 30, the plasma gas supply 40, the raw material gas supply 50, or the like. The controller includes a central processing unit (CPU), a read only memory (ROM), and a random access memory (RAM).

The CPU executes a predetermined processing according to a recipe (process recipe) stored in a storage area such as a RAM. Control information of the plasma processing apparatus 100 with respect to process conditions is set in the recipe. The control information includes, for example, the gas flow rate, the pressure in the processing container 10, the temperature in the processing container 10, and the process time. For example, when forming the SiN film, the recipe includes a sequence in which the inside of the processing container 10 is controlled at a predetermined pressure and a predetermined temperature, plasma is generated for a predetermined time, and then the raw material gas is supplied for a predetermined time, and the plasma generation and the supply of the raw material gas are repeatedly performed by a predetermined number of times.

The recipe and the program applied by the controller may be stored in, for example, a hard disk, a compact disk, a magneto-optical disk, or the like. Further, the recipe or the like may be set and read in the controller in a state of being accommodated in a storage medium readable by a portable computer such as a CD-ROM, a DVD, a memory card, or the like. In addition, the controller includes an input device such as a keyboard or a mouse for an input operation of commands or the like, a display device such as a display that visually shows the operation status of the plasma processing apparatus 100, and a user interface that is an output device such as a printer.

(Modification of Plasma Generator)

Figure 4:
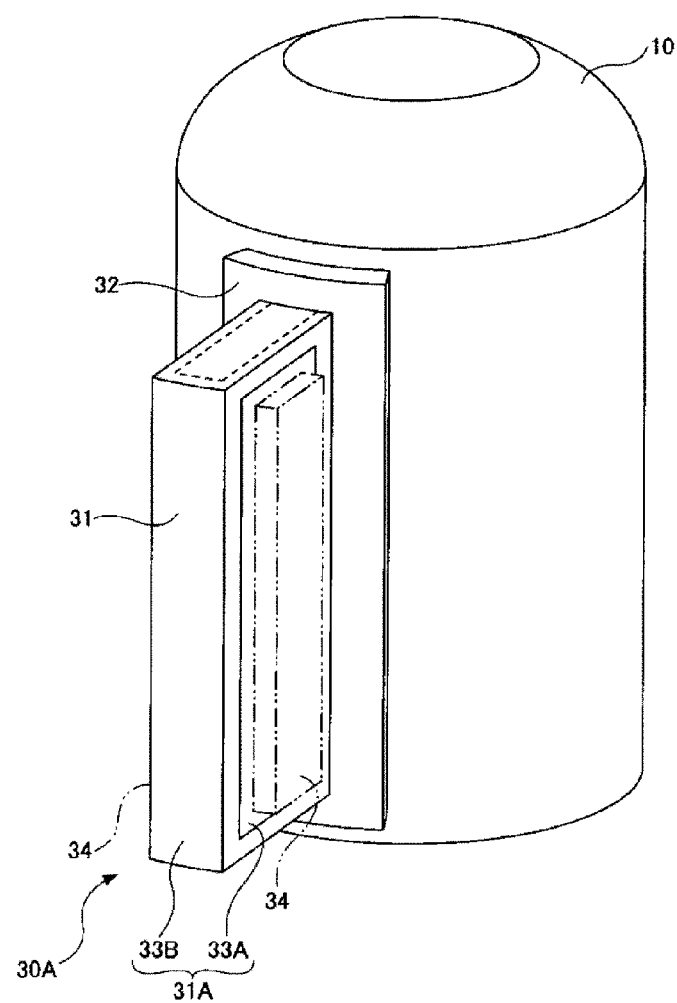
FIG. 4 is a view illustrating a modification of a plasma generator together with a processing container.

Next, a modification of the plasma generator will be described with reference to FIG. 4. In the plasma processing apparatus 100 illustrated in FIGS. 1 to 3, all the hollow protrusion 31 including the flange 32 in the plasma generator 30 is formed of synthetic quartz. Meanwhile, in a plasma generator 30A according to the modification illustrated in FIG. 4, a region corresponding to the plasma electrode 34 in a hollow protrusion is a first region 33A that is formed of synthetic quartz. Then, the other region including the flange 32 is a second region 33B that is formed of natural quartz, and a hollow protrusion 31A is formed by connecting the first region 33A and the second region 33B by welding.

Here, the "region corresponding to the plasma electrode 34" refers to a region to which the plasma electrode 34 is attached, and also a region slightly wider than the region to which the plasma electrode 34 is attached. Although described in detail below, according to the verification of the present inventors, it has been identified that a location where the maximum principal stress is generated in the wall surface of the hollow protrusion due to plasma sputtering or etching is the contour line of the plasma electrode and the vicinity thereof.

Figure 5:
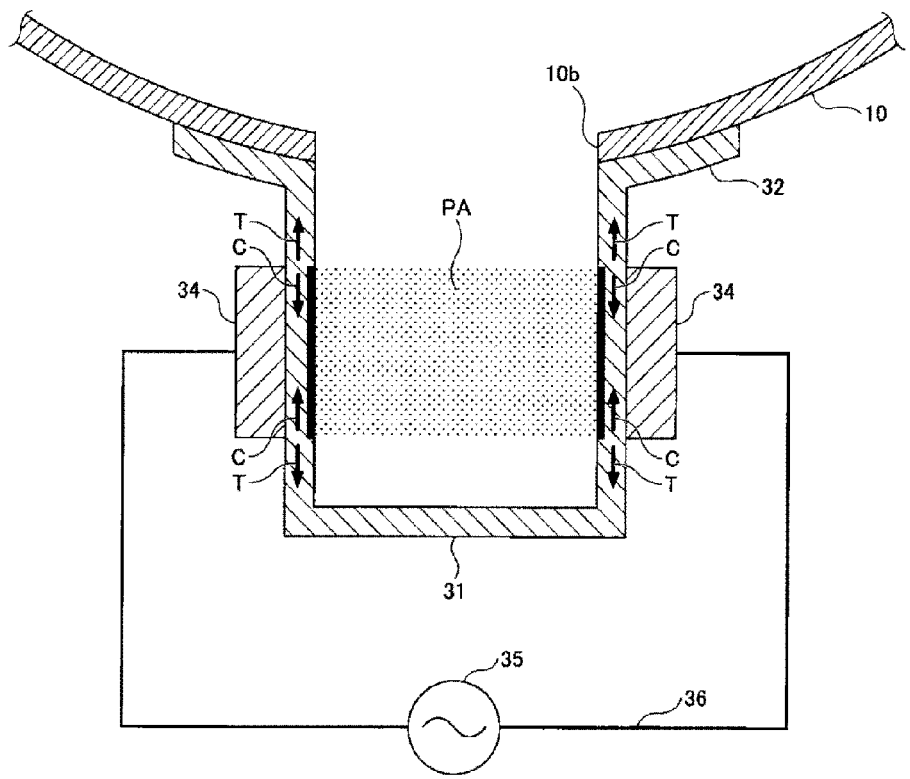
FIG. 5 is a schematic view illustrating that a maximum principal stress is generated in the vicinity of an interface of a plasma electrode of a hollow protrusion, together with deterioration of a wall surface of the hollow protrusion corresponding to the plasma electrode.

Specifically, as illustrated in FIG. 5, a compressive stress C is generated at the inside (center side of the plasma electrode 34) of the contour of the plasma electrode 34 in the wall surface of the hollow protrusion 31, and an tensile stress T is generated at the outside (side away from the plasma electrode 34) of the plasma electrode 34. As a result, the maximum principal stress is generated at the contour location of the plasma electrode 34 or at the vicinity thereof in the wall surface of the hollow protrusion 31.

Therefore, a region slightly wider than the region to which the plasma electrode 34 is attached may be referred to as the first region 33A, and damage to the plasma generator 30A may be suppressed by forming the first region 33A from synthetic quartz. For example, a range of approximately 5 cm to 20 cm wider than the region to which the plasma electrode 34 is attached may be set as the first region 33A.

<Method for Plasma Processing>

Next, an example of a method for plasma processing according to an embodiment using the plasma processing apparatus 100 illustrated in FIGS. 1 to 3 will be described. Here, an ALD method is applied, and a process sequence that forms the SiN film on the wafer W using $NH_3$ gas as a plasma gas and DCS gas as a raw material gas will be described.

Firstly, approximately 30 sheets to 50 sheets of wafers W are mounted on the wafer boat 20, and are loaded into the processing container 10. Then, the temperature of the inside of the processing container 10 is adjusted to a predetermined process temperature, and the inside of the processing container 10 is exhausted to adjust to a predetermined process pressure.

Next, in the plasma generator 30, the radio-frequency power supply 35 is controlled to be ON so as to apply the radio-frequency voltage between the plasma electrodes 34, and $NH_3$ gas is supplied between the plasma electrodes 34 from the plasma gas supply pipe 41. The plasma generating area PA is formed in the hollow in the hollow protrusion 31 by supplying the $NH_3$ gas. In the plasma generating area PA, radicals (active species) such as $NH_4^*$, $NH_3^*$, $NH_2^*$, $NH^*$, $N_2^*$, $H_2^*$, and $H^*$ (symbol * refers to a radical) are generated. Further, ions (active species) such as $H_4+$, $NH_3^+$, $NH_2^+$, $NH^+$, $N_2^+$, and $H_2^+$ are generated.

Active species such as ammonia radicals are supplied into the processing container 10 and chemically absorbed onto the surface of the wafer W, thereby purging the inside of the processing container 10. Here, the expression "purging" refers to flowing of an inert gas such as nitrogen ($N_2$) gas into the processing container 10, or operating a vacuum exhaust system to remove the residual gas in the processing container 10. For example, supply and purge of the ammonia radicals are performed for several tens of seconds to several minutes.

Next, the DCS gas is supplied into the processing container 10 from the raw material gas supply pipe 51, and is chemically absorbed onto the surface of the wafer W. The supply of the DCS gas is performed, for example, for several minutes. The ammonia radicals are attached onto each wafer W in advance, and the supplied DCS gas reacts with the ammonia radicals, and as a result, one layer of SiN film is formed on the surface of each wafer W. Examples of process conditions in the method for plasma processing according to the embodiment are as follows. That is, the process conditions are the process temperature in a range of approximately 300° C. to 600° C., the process pressure of 1333 pa (10 torr) or less, the flow rate of $NH_3$ gas of 3000 sccm (standard cc/min) or less, and the flow rate of DCS gas in a range of approximately 10 sccm to 80 sccm.

In the film forming using the ALD method, the SiN film having a predetermined thickness is formed on the surface of the wafer W by performing the above-described sequence repeatedly by a predetermined number of times.

<Analysis and Interpretation to Verify Damage of Silica Glass Surface by Plasma>

The present inventors verified that the silica glass surface is damaged by plasma, by using various methods.

(EPMA Analysis)

Firstly, electron probe micro analyzer (EPMA) analysis and its results will be described. As already described above using FIG. 5, when the film forming process that generates plasma is repeatedly performed over a long period of time, the silica glass surface at a position, where the plasma electrode is installed, in the inside of the hollow protrusion made of silica glass may be damaged by sputtering or etching by plasma. In particular, when plasma of a hydrogen-containing gas (such as $NH_3$ gas, $H_2$ gas) that does not contain oxygen and contains hydrogen is generated, ions or radicals that contain hydrogen generated in the plasma selectively react with oxygen in the silica glass. As a result, oxygen is extracted from the surface layer of the silica glass. Specifically, OH groups in the silica glass are extracted from the surface layer of the silica glass, and byproducts such as $H_2O$ and $SiH_4$ are produced.

A part of silica glass of a hollow protrusion of a plasma generator in a processing container that has been used for a long time was cut off, and the EPMA analysis was performed on a cross-section in the plate thickness direction. The results of the EPMA analysis are illustrated in FIG. 6.

Figure 6:
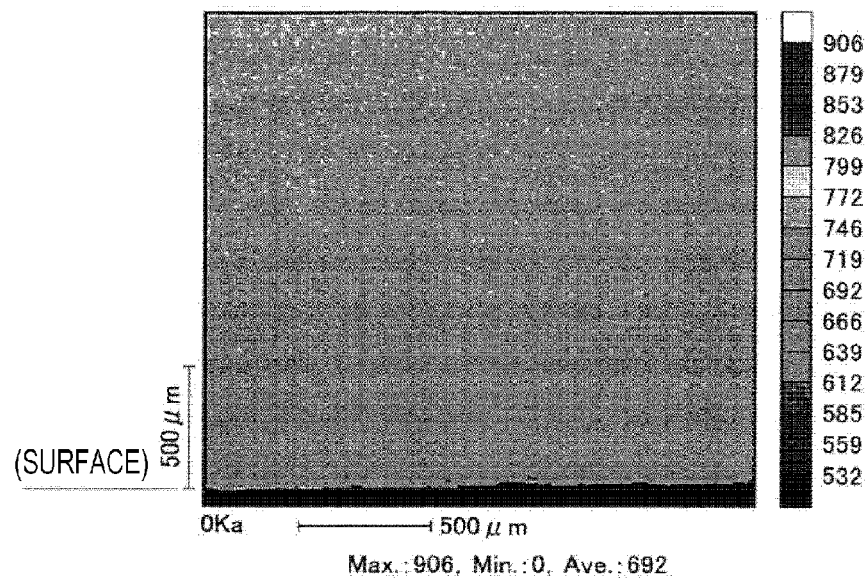
FIG. 6 is a view illustrating an EPMA analysis result of oxygen concentration according to a distance from an inner surface of the hollow protrusion.

In FIG. 6, it may be found that the oxygen concentration is decreased from the surface layer of the silica glass in contact with the plasma to a range of 500 μm (particularly, a range of up to 200 μm). From the analysis results, it is proved that the decrease of the oxygen concentration is remarkable as being closer to the silica glass surface in contact with the plasma.

When the strain stress in the vicinity of the altered layer in which the oxygen concentration in the silica glass is decreased is measured by the sensitive color method, stress is generated in the vicinity of the altered layer, and the maximum principal stress is observed at the boundary between the both ends of the altered layer and the normal portion (see FIG. 5). The maximum principal stress is localized in the thickness range of 100 μm to 200 μm of the surface layer of the silica glass, and the location where the maximum principal stress is generated may be a failure origin point. It is surmised that the stress is generated due to reconstruction of the microstructure of the silica glass, and volume shrinkage, by the recombination of structural defects such as an E' center (E-prime center) generated by oxygen reduction or oxygen deficient center (ODC). The E center is a structure in which one unpaired electron is present in Si bonded with three oxygens in a glass network.

(Raman Spectroscopic Analysis)

Next, the Raman spectroscopic analysis and the results thereof will be described which were performed to confirm the structural change of the altered layer of the silica glass described above. Firstly, a relative amount of the silanol groups in the thickness direction of the altered layer was measured. A Raman band derived from stretching vibration of the OH group was weakly observed around 3,680 $cm^{-1}$.

Therefore, by calculating a relative intensity (I(3680)/I(800)) of a band at 3,680 $cm^{-1}$ to a band at 800 $cm^{-1}$, the relative amount change of the silanol group (OH group) in the thickness direction from the surface of the inside of the hollow protrusion in the plasma generator. The results are illustrated in FIG. 7.

Figure 7:
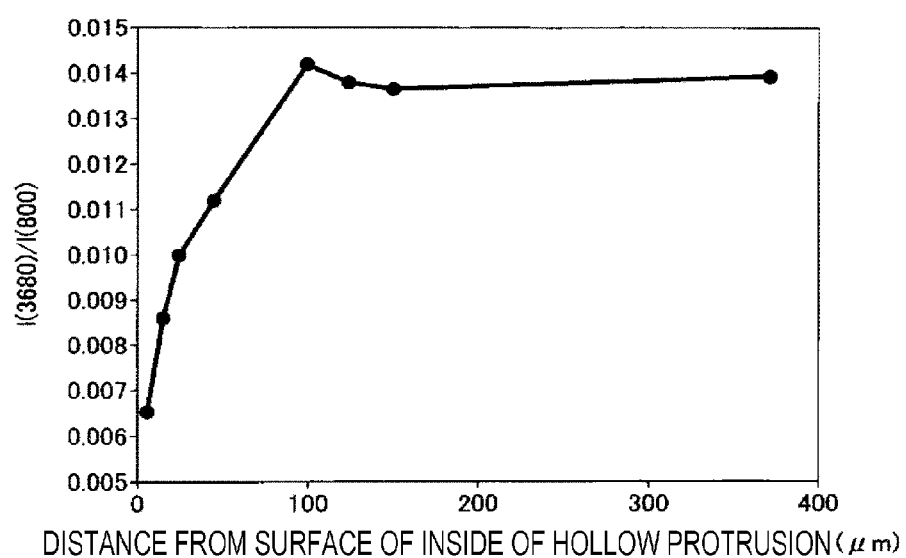
FIG. 7 is a view illustrating a Raman spectroscopic analysis result regarding a relative amount of silanol group according to the distance from the inner surface of the hollow protrusion.

In FIG. 7, it may be found that the concentration of the OH group is decreased on the surface side of the inside of the hollow protrusion, particularly in a range of 50 μm from the surface of the inside.

Figure 8A:
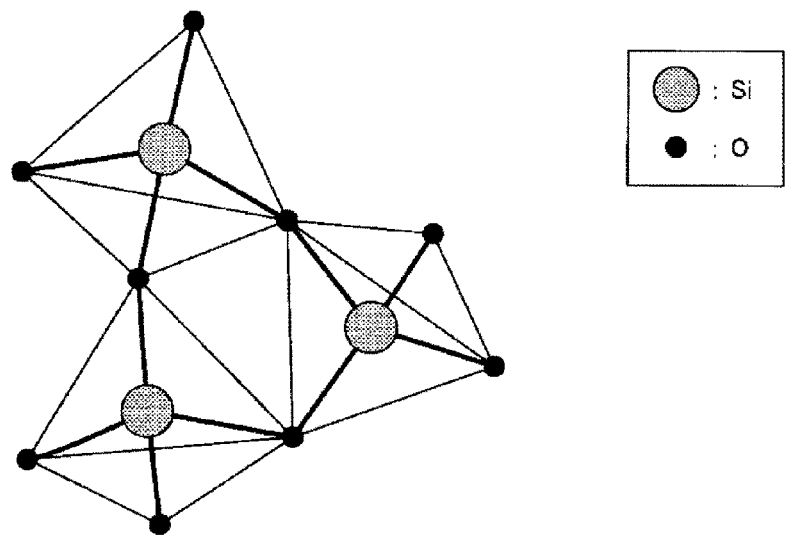
FIG. 8A is an explanatory view of a three-membered ring structure in silica glass.
Figure 8B:
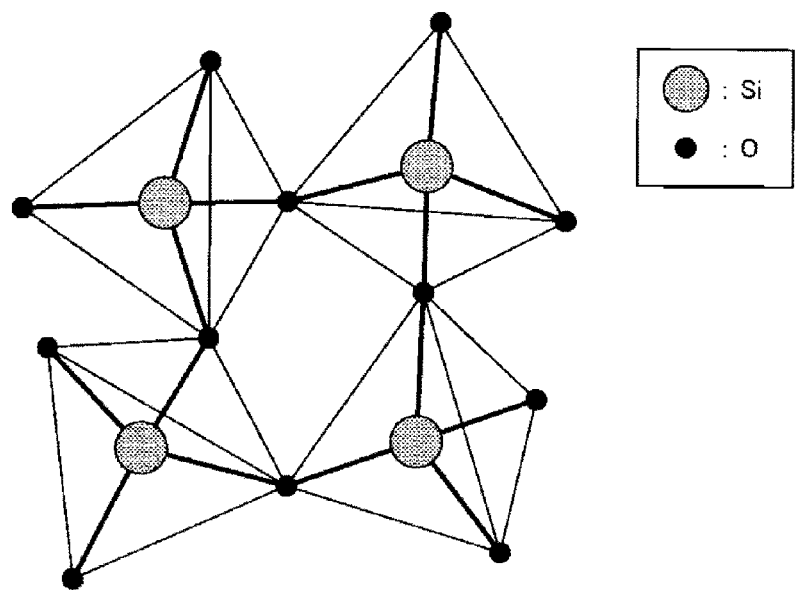
FIG. 8B is an explanatory view of a four-membered ring structure in silica glass.

Next, bands at 610 $cm^{-1}$ and 495 $cm^{-1}$ corresponding to the three-membered ring structure and the four-membered ring structure in the silica glass were analyzed. The three-membered ring structure and the four-membered ring structure in the silica glass are illustrated in FIGS. 8A and 8B, respectively.

A relative intensity (I(610)/I(800)) of a band at 610 $cm^{-1}$ to a band at 800 $cm^{-1}$, and a relative intensity (I(495)/I(800)) of a band at 495 $cm^{-1}$ to the band at 800 $cm^{-1}$ were calculated. Then, based on such calculation results, the relative amount change of the silanol group (OH group) in the thickness direction from the surface of the hollow protrusion in the plasma generator was calculated. The results are illustrated in FIGS. 9 and 10, respectively.

Figure 9:
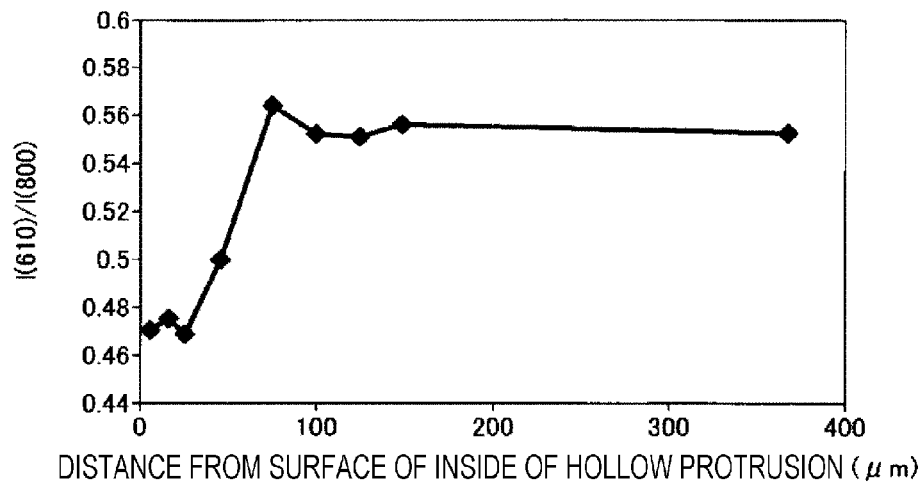
FIG. 9 is a view illustrating a Raman spectroscopic analysis result regarding a proportion of the three-membered ring structure according to the distance from the inner surface of the hollow protrusion.
Figure 10:
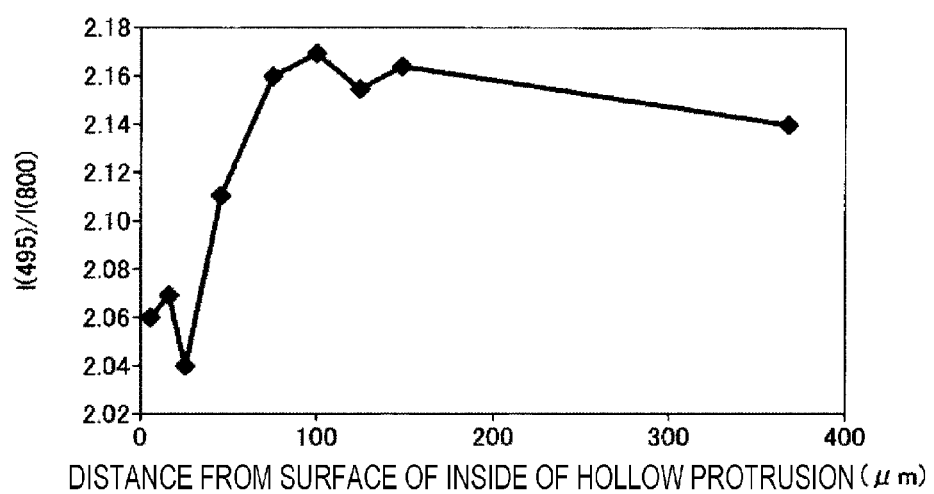
FIG. 10 is a view illustrating a Raman spectroscopic analysis result regarding a proportion of the four-membered ring structure according to the distance from the inner surface of the hollow protrusion.

In FIGS. 9 and 10, it may be found that the concentration of the OH group is decreased on the surface side of the inside of the hollow protrusion, particularly in a range of 50 μm from the surface. It was suggested that a proportion of the three-membered ring structure and the four-membered ring structure in the silica glass was small as all values of I(610)/I(800) and the values of I(495)/I(800) were small. That is, it was inferred that the proportion of the three-membered ring structure and the four-membered ring structure in a range of approximately 50 μm from the hollow protrusion surface was decreased.

Further, it is understood that the decrease in the value of I(610)/I(800) and I(495)/I(800), that is the decrease of three-membered ring structure and the four-membered ring structure is correlated with the decrease in density of the silica glass when fictive temperature (temperature at which the structure of the silica glass is considered to be frozen) is 1,500° C. or less. From this, it is surmised that the density of quartz is decreased in the range of approximately 50 μm in thickness from the surface of the analysis sample.

As described above, it is surmised from the results of the EPMA analysis and the Raman spectroscopic analysis that the stress generated in the altered layer in the silica glass on a plane that is in contact with the plasma is caused by a mechanism in which first to third phases are generated successively. Firstly, the first phase is a decrease in the density of the surface layer of the silica glass in consequence of oxygen reduction by the plasma that contains hydrogen. Next, the second phase is volume shrinkage by the recombination of anoxic defects in the silica glass. Lastly, the third phase is the generation and accumulation of strain inside the silica glass.

(Structure Analysis)

Figure 11:
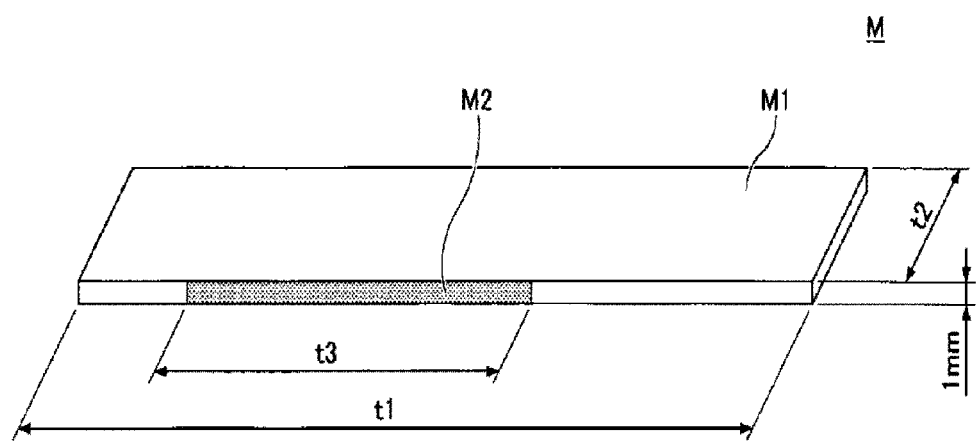
FIG. 11 is a view illustrating a pseudo model used in thermal stress analysis that verifies a generation location of the maximum principal stress in the vicinity of the interface of the plasma electrode in the hollow protrusion.

Next, structure analysis using a pseudo model was performed so as to verify the reason why the maximum principal stress is generated at both ends of the altered layer. A pseudo model M created in a computer for the present structure analysis is illustrated in FIG. 11. In the simulation model M, in order to substitute the shrinkage due to the structural change of the altered layer of the silica glass with thermal shrinkage of metal with respect to the silica glass model M1, an altered layer model M2 by an aluminum member was simulated as a heat shrinkage model by the temperature change.

The thickness of a quartz glass member that has the same size as the silica glass of the hollow protrusion of the plasma generator was 1 mm, and the altered layer by the plasma was substituted with aluminum having a large linear expansion coefficient. In FIG. 11, the length of the silica glass model M1 was t1, the width of the plasma electrode in the silica glass model M1 was t2, and the length of the altered layer was t3. Aluminum that simulates the altered layer was A5052, and the thickness thereof was set to 0.3 mm. Further, the linear expansion coefficients of the silica glass and the aluminum A5052 were set to $4.8 \times 10^{-7}$ ($K^{-1}$) and $2.38 \times 10^{-5}$ ($K^{-1}$), respectively.

Figure 12A:
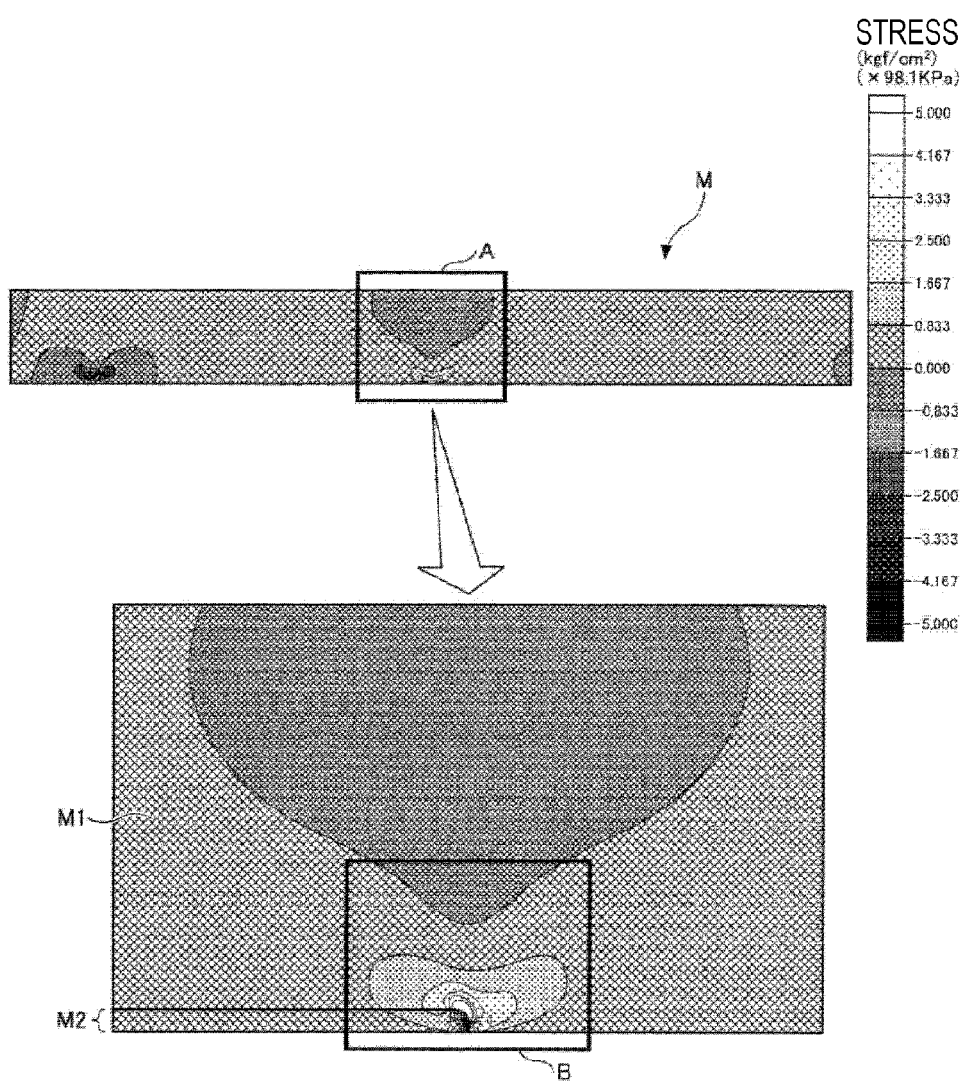
FIG. 12A is a view illustrating a thermal stress analysis result, and an upper view is a stress diagram of the entire model, and a lower view is a stress diagram that shows an enlarged square region of the upper view.
Figure 12B:
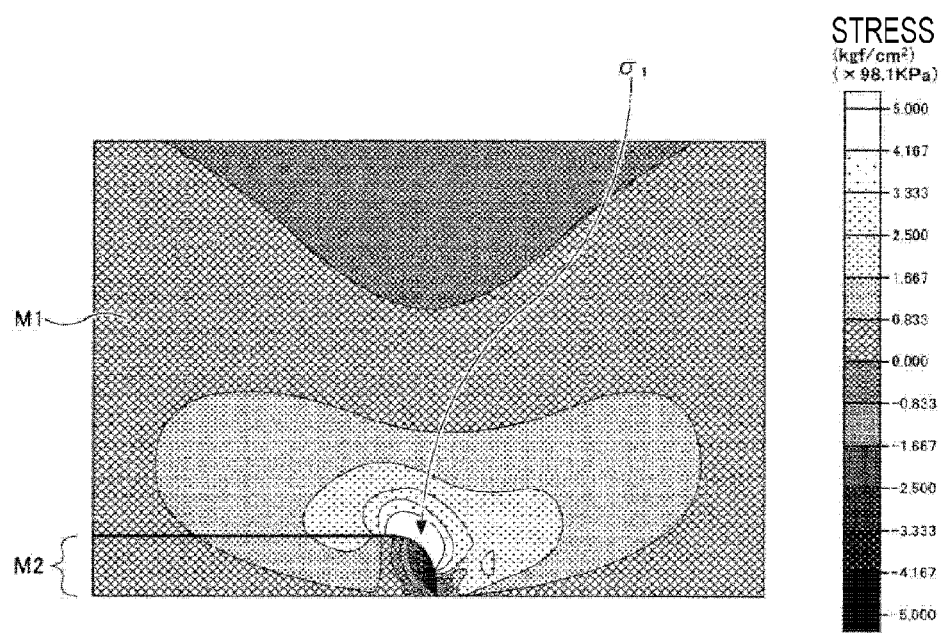
FIG. 12B is a view illustrating a stress diagram that shows a further enlarged square region in FIG. 12A.

The temperature was lowered by 100° C. from the steady state, and the stress generated in the aluminum and the silica glass was calculated. The results thereof are illustrated in FIGS. 12A and 12B. Here, FIG. 12A is a view illustrating the thermal stress analysis results, in which the upper view is a stress diagram of the entire model. Further, the lower view is a stress diagram that shows the enlarged square region in the upper view, and FIG. 12B is a stress diagram that shows a further enlarged square region in FIG. 12A.

It was found out that the maximum principal stress generated at the edge part of the aluminum layer assumed to be the altered layer from FIGS. 12A and 12B. This result is the result obtained by observing the actual sample by the sensitive color method. From the analysis result, it was reproduced that the maximum principal stress σ1 generated at the inner boundary end portion between the altered layer and the normal layer, due to the volume shrinkage of the altered layer.

(Verification of Correlation between OH Group Concentration and Maximum Principal Stress)

Next, verification of correlation between the OH group concentration and the maximum principal stress was performed. As described already, the surface layer of the silica glass immediately below the plasma electrode in contact with the plasma may be damaged by sputtering or etching by the plasma of hydrogen-containing gas that does not contain oxygen and contains hydrogen. As a result, the surface layer of the silica glass becomes anoxic, and shrinks in volume due to the density decrease and the structural reconstruction. Due to the volume shrinkage, a large stress is generated at the end portion of the altered layer, and the silica glass may be led to breakage.

Here, with respect to the silica glass in the plasma generating area immediately below the plasma electrode, an accelerated experiment was conducted in which a thin silica glass chip was installed in a manner that does not affect plasma generation, and was exposed to ammonia at the same temperature as the actual film forming temperature for a certain period of time. The relationship between the etching amount of the silica glass chip and the maximum principal stress generated in the silica glass chip was investigated. The experimental results are illustrated in FIG. 13.

Figure 13:
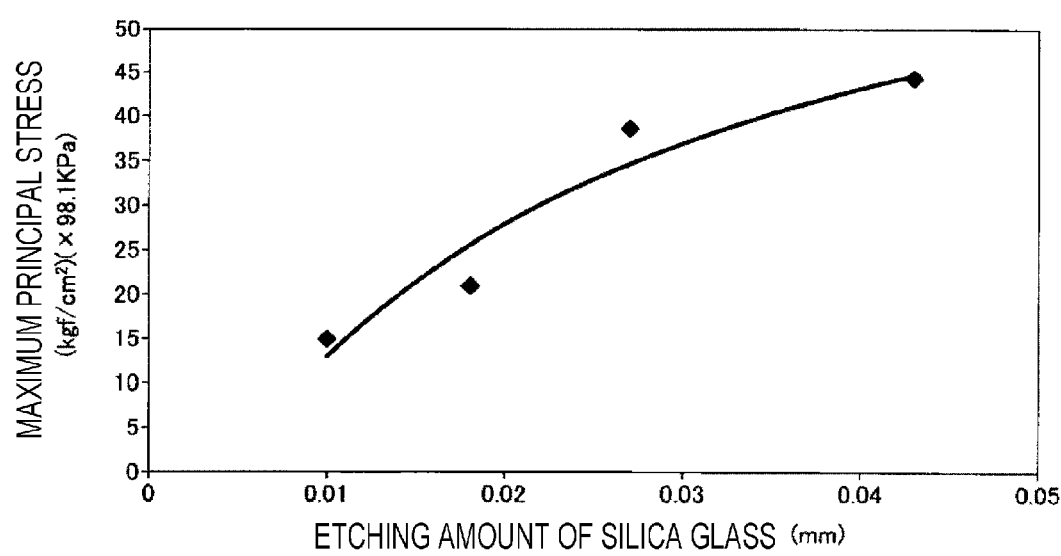
FIG. 13 is a view illustrating an experiment result regarding a relationship between an etching amount of silica glass and the maximum principal stress generated in the silica glass.

As illustrated in FIG. 13, a correlation between the etching amount of the silica glass chip and the maximum principal stress generated in the silica glass chip was found. In the range of the etching amount evaluated, it was found that as the etching amount increased, the generated stress increased as well. It was also found that the etching amount depended on the processing temperature and the etching was hardly generated at room temperature.

By this phenomenon, that is, if selective oxygen reduction and etching of the silica glass surface layer by plasma is able to be reduced, it is possible to provide a plasma processing apparatus having a plasma generator that may be stably used over a long period of time. For this purpose, it was found that the silica glass that is hard to reduce oxygen and to be etched by plasma of ammonia gas or hydrogen gas may be applied to the plasma generator.

It has been assumed that the plasma generator is formed of synthetic quartz that is finer in fine structure than natural quartz that has been applied to the plasma generator, and is expected to have higher etching resistance. Further, the OH group concentration serves as a component that influences the characteristics of synthetic quartz that is used in an optical system, and the etching amount by the ammonia plasma was evaluated using the silica glass chip with the OH group concentration as a parameter. The results are illustrated in FIG. 14.

Figure 14:
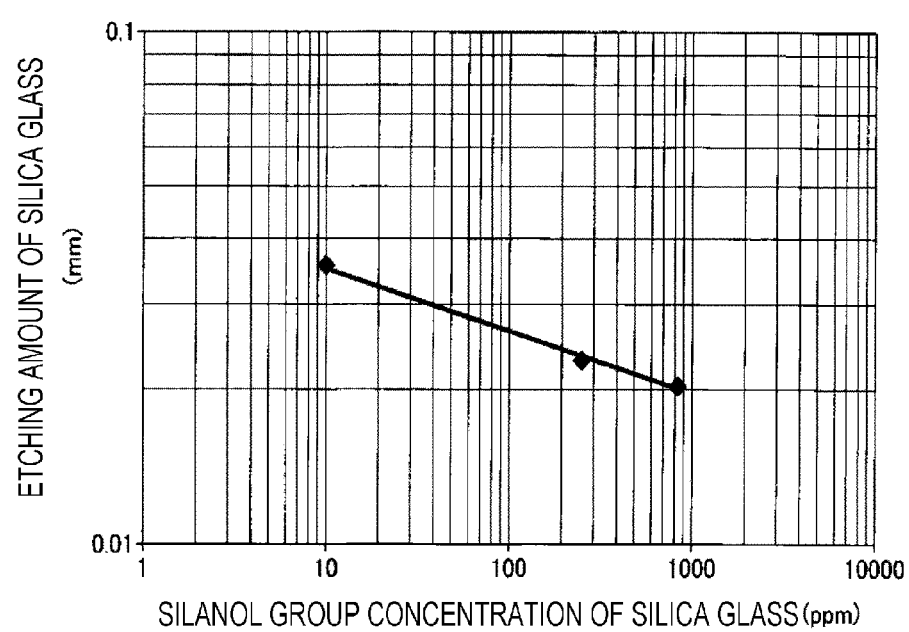
FIG. 14 is a view illustrating an experiment result regarding a relationship between silanol group concentration of the silica glass and the etching amount of the silica glass.

Although the observation number of times is small, it may be found from FIG. 14 that the etching amount decreases as a power function of the OH group concentration as the OH group concentration increases.

It may be found from FIGS. 13 and 14 that the OH group concentration is correlated to the maximum principal stress generated in the silica glass. That is, as the OH group concentration increases, the maximum principal stress decreases. Therefore, the synthetic quartz that contains at least 90 ppm to 100 ppm or more, and desirably 200 ppm or more of the OH group is applied to the plasma generator.

More specifically, it may be found that the stress decrease effect of the synthetic quartz that has the OH group concentration of 90 ppm to 100 ppm is approximately 40% with respect to the stress generated in the natural glass that has the OH group concentration of approximately 10 ppm. Further, it may be found that the stress decrease effect of the synthetic quartz that has the OH group concentration of 200 ppm is approximately 60% with respect to the stress generated in the natural glass that has the OH group concentration of approximately 10 ppm. Based on the results, the above numerical range was defined as a proper range.

Although the plasma processing apparatus 100 in the illustrated example is a batch type vertical furnace, it may be other types of plasma processing apparatus. For example, it may be a type in which the processing container is a hollow disc-shaped processing container, a rotary table configured to mount a plurality of substrates and rotate is accommodated in the processing container, and the raw material gas supply that supplies the raw material gas and the reaction gas supply that supplies the reaction gas are arranged on the upper surface of the rotary table.

In this plasma processing apparatus, a part of the top plate included in the processing container serves as the plasma generator, and the part of the top plate is formed of synthetic quartz. Then, a plasma electrode that is constituted by an inductive coupled plasma (ICP) generating electrode may be arranged in the plasma generator of the top plate. Since this plasma processing apparatus may perform the film forming process on approximately five sheets of wafers W at once, it may be called as a so-called semi-batch type plasma processing apparatus.

Further, a single-sheet type plasma processing apparatus may be used that accommodates a single wafer W in the disc-shaped processing container and performs the film forming process thereon. This plasma processing apparatus includes an antenna chamber above the inside of the processing container, and a chamber that includes a susceptor is formed below the antenna chamber. In the processing container, for example, a wall surface that constitutes the antenna chamber may be formed of synthetic quartz.

The inductive-coupled type plasma processing apparatus may be applied to this plasma processing apparatus, but otherwise, electron cyclotron resonance plasma (ECP) may be applied. Further, helicon wave excited plasma (helicon wave plasma (HWP)) may be applied. Further, microwave excited surface wave plasma (surface wave plasma (SWP)) may be applied.

In the illustrated example, the film forming method of the silicon nitride film to which the ALD method is applied using the plasma processing apparatus 100 is described, but the plasma processing apparatus 100, and the semi-batch type plasma processing apparatus and the single-sheet type plasma processing apparatus that have the features of the present disclosure is properly used for the etching process.

According to the present disclosure, a plasma processing apparatus and a method for plasma processing may be provided that suppress damage to a plasma generator due to generation of plasma.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
   a processing container configured to accommodate a substrate; and
   a plasma generator provided with a plasma electrode and configured to perform a plasma processing on the substrate accommodated in the processing container,
   wherein the plasma generator has a region to which the plasma electrode is attached,
   the plasma generator is formed of synthetic quartz only, and other quartz members of the plasma processing apparatus than the plasma generator are formed of natural quartz, and
   a concentration of OH groups in the synthetic quartz is 200 ppm.

2. The plasma processing apparatus according to claim 1, wherein a concentration of OH groups in the synthetic quartz ranges from 90 ppm to 100 ppm or more.

3. The plasma processing apparatus according to claim 2, wherein the concentration of OH groups in the synthetic quartz is 200 or more.

4. The plasma processing apparatus according to claim 3, wherein the plasma generator includes a plasma gas supply configured to supply a plasma gas, which is formed into plasma via the plasma electrode, into the processing container, and
   the plasma gas is a hydrogen-containing gas that is oxygen-free.

5. The plasma processing apparatus according to claim 4, wherein the hydrogen-containing gas is one of $NH_3$ gas or $H_2$ gas.

6. The plasma processing apparatus according to claim 5, wherein the processing container is a vertically cylindrical processing container,
   a substrate holder is provided inside the processing container and configured to hold a plurality of substrates in multi-tiers, and
   the processing container includes a hollow protrusion that is provided to protrude outwardly from a part of a cylindrical side wall and extend in a height direction of the side wall, and the hollow protrusion forms the plasma generator.

7. The plasma processing apparatus according to claim 6, wherein, in the hollow protrusion, a pair of parallel flat type plasma electrodes are arranged on a pair of side surfaces facing each other across the hollow.

8. The plasma processing apparatus according to claim 2, wherein the processing container has a hollow disc-shape,
   a rotary table is provided inside the processing container and configured to rotate the plurality of substrates placed thereon,
   a raw material gas supply and a reaction gas supply are arranged on an upper surface of the rotary table to supply a raw material gas and a reaction gas, respectively, and
   a part of a top plate included in the processing container is the plasma generator.

9. The plasma processing apparatus according to claim 8, wherein the plasma electrode is an inductively coupled plasma generating electrode and is arranged in the plasma generator of the top plate.

10. The plasma processing apparatus according to claim 1, wherein the plasma generator includes a plasma gas supply configured to supply a plasma gas, which is formed into plasma via the plasma electrode, into the processing container, and
    the plasma gas is a hydrogen-containing gas that is oxygen-free.

11. The plasma processing apparatus according to claim 1, wherein the processing container is a vertically cylindrical processing container,
    a substrate holder is provided inside the processing container and configured to hold a plurality of substrates in multi-tiers, and
    the processing container includes a hollow protrusion that is provided to protrude outwardly from a part of a cylindrical side wall and extend in a height direction of the side wall, and the hollow protrusion forms the plasma generator.

12. The plasma processing apparatus according to claim 1, wherein the processing container has a hollow disc-shape,
    a rotary table is provided inside the processing container and configured to rotate the plurality of substrates placed thereon,
    a raw material gas supply and a reaction gas supply are arranged on an upper surface of the rotary table to supply a raw material gas and a reaction gas, respectively, and
    a part of a top plate included in the processing container is the plasma generator.

13. The plasma processing apparatus according to claim 11, wherein the processing container further includes a flange provided at an end portion of the a hollow protrusion,
    the flange is attached to the cylindrical side wall,
    the hollow protrusion and the flange form the plasma generator,
    the hollow protrusion and the flange are formed of the synthetic quartz, and
    other quartz members of the plasma processing apparatus than the hollow protrusion and the flange are formed of natural quartz.

* * * * *